US011817168B2

(12) United States Patent
Duval

(10) Patent No.: US 11,817,168 B2
(45) Date of Patent: Nov. 14, 2023

(54) ENVIRONMENTAL CONDITION TRACKING FOR A MEMORY SYSTEM

(71) Applicant: Micron Technology, Inc., Boise, ID (US)

(72) Inventor: Olivier Duval, Pacifica, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/456,972

(22) Filed: Nov. 30, 2021

(65) Prior Publication Data

US 2023/0170036 A1  Jun. 1, 2023

(51) Int. Cl.
*G11C 29/12* (2006.01)
*G11C 29/42* (2006.01)
*G11C 29/44* (2006.01)
*G11C 7/10* (2006.01)
*G11C 7/04* (2006.01)
*G11C 29/18* (2006.01)

(52) U.S. Cl.
CPC ........... *G11C 29/42* (2013.01); *G11C 7/04* (2013.01); *G11C 7/1069* (2013.01); *G11C 7/1096* (2013.01); *G11C 29/12015* (2013.01); *G11C 29/18* (2013.01); *G11C 29/4401* (2013.01)

(58) Field of Classification Search
CPC ......... G11C 29/42; G11C 7/04; G11C 7/1069; G11C 7/1096; G11C 29/12015; G11C 29/18; G11C 29/4401
USPC ............................................ 365/185.09, 208
See application file for complete search history.

(56) References Cited

U.S. PATENT DOCUMENTS

| 8,705,279 | B2* | 4/2014 | Kim | G11C 11/5642 365/201 |
| 8,837,215 | B2* | 9/2014 | Lee | G11C 16/10 365/185.12 |
| 8,898,548 | B1* | 11/2014 | Mullendore | G06F 11/1048 714/751 |
| 2013/0336059 | A1* | 12/2013 | Lee | G11C 29/82 365/185.11 |
| 2015/0049547 | A1* | 2/2015 | Kim | G11C 29/023 365/185.09 |
| 2017/0255403 | A1* | 9/2017 | Sharon | G11C 11/5628 |

(Continued)

FOREIGN PATENT DOCUMENTS

WO    WO-2009107443 A1 *  9/2009  ............ G11C 16/32

OTHER PUBLICATIONS

Abbasi, Affan, Memory Module Design for High-Temperature Applications in SiC CMOS Technology, 2021, University of Arkansas, All pages. (Year: 2021).*

*Primary Examiner* — Michael T Tran
(74) *Attorney, Agent, or Firm* — Holland & Hart LLP

(57) ABSTRACT

Methods, systems, and devices for environmental condition tracking for a memory system are described. A memory system may include one or more sensors (e.g., temperature sensors) for identifying a temperature of a memory device. For example, the sensor(s) may identify a first temperature of the memory device when performing a write operation on a memory cell and may identify a second temperature of the memory device when performing a read operation on the memory cell. The memory system may determine a performance characteristic of the memory device based on a correlation between the first temperature and the second temperature and may transmit the performance characteristic to a server.

21 Claims, 7 Drawing Sheets

(56) References Cited

U.S. PATENT DOCUMENTS

| | | | |
|---|---|---|---|
| 2019/0043559 A1* | 2/2019 | McVay | G06F 3/0634 |
| 2022/0139484 A1* | 5/2022 | Kim | G11C 29/4401 |
| | | | 365/185.09 |
| 2023/0004310 A1* | 1/2023 | Kondo | G06F 3/0659 |
| 2023/0010029 A1* | 1/2023 | Kim | G11C 16/26 |
| 2023/0039381 A1* | 2/2023 | Bueb | G11C 5/148 |

* cited by examiner

ENVIRONMENTAL CONDITION TRACKING FOR A MEMORY SYSTEM

FIELD OF TECHNOLOGY

The following relates generally to one or more systems for memory and more specifically to environmental condition tracking for a memory system.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not- or (NOR) and not- and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Some memory systems, such as non-volatile memory systems (e.g., memory systems that include non-volatile memory cells, such as NAND memory cells or Flash memory cells), may incur errors or performance issues due to temperature variations. For example, extreme environmental conditions (such as temperatures) or disparities in those conditions between access operations may result in relatively high error rates, increased latency, increased bandwidth, and the like. Moreover, the extreme environmental conditions or the disparities in conditions between access operations may add complexity to the design and testing phase of a memory device. Accordingly, it may be desirable to track the performance characteristics of a memory device at different conditions (e.g., temperatures) in order to improve the device's overall performance.

A system configured to monitor the temperature and associated performance of a memory device is described herein. In some examples, the system may include a host system and a memory device that may each include one or more sensors (e.g., temperature sensors). The sensors may be configured to monitor a temperature of the memory device, or the environment of the memory device, at different instances. For example, the system may identify a first temperature of the memory device (or the environment of the memory device) during a write operation and may then identify a second temperature of the memory device during an associated read operation.

The system may determine one or more performance characteristics based on a correlation between the temperatures. As used herein, a performance characteristic of a memory device (or of a memory system) may refer to a latency associated with the memory device based on performing the access operation(s), a bandwidth of the memory device based on performing the access operations(s), a likelihood of an error occurring based on performing the access operations(s), or the like. Accordingly, the system may utilize the performance characteristics during subsequent access operations to improve the system's overall performance.

Figure 1:
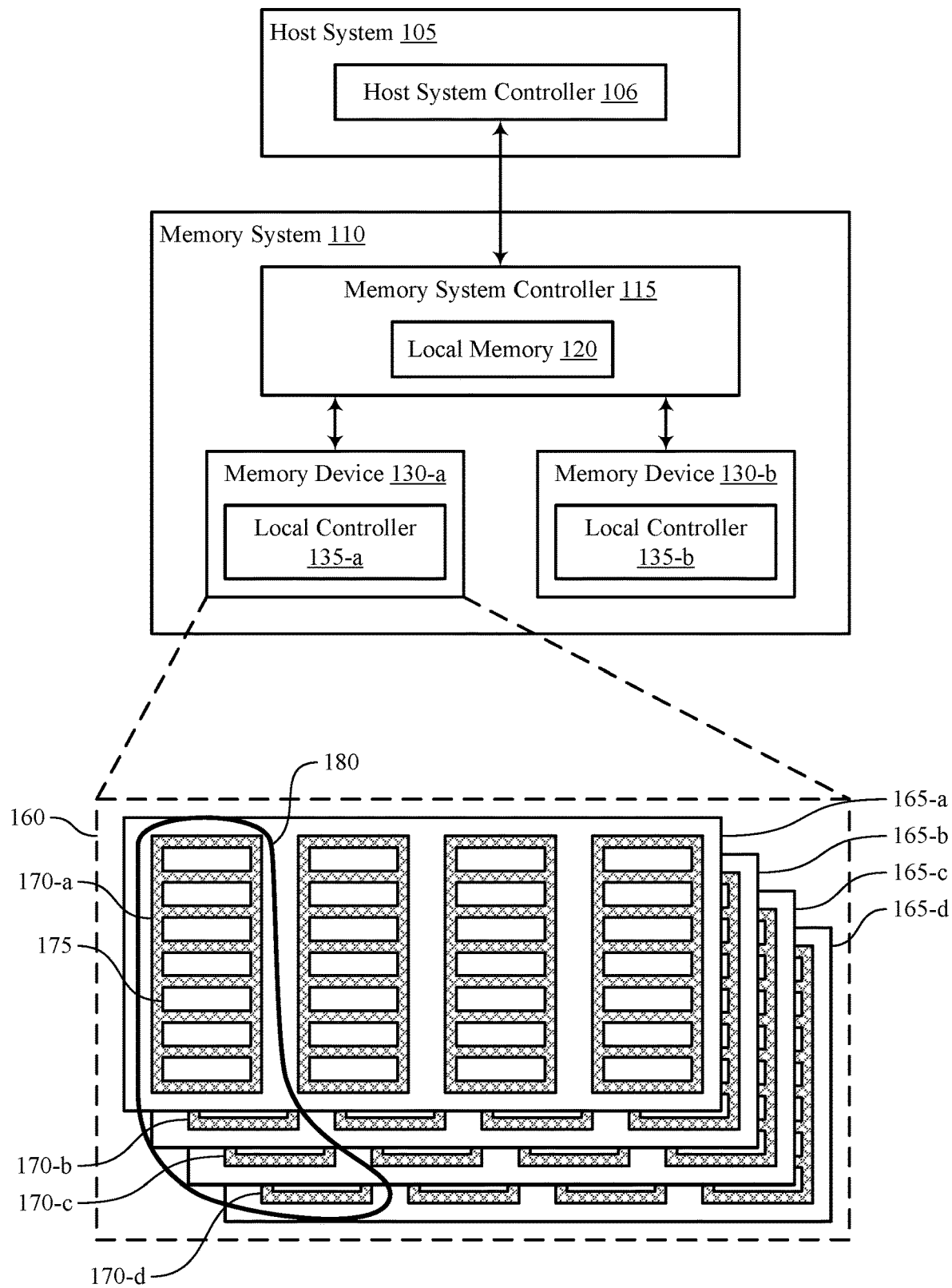
FIG. 1 illustrates an example of a system that supports environmental condition tracking for a memory system in accordance with examples as disclosed herein.
Figure 2:
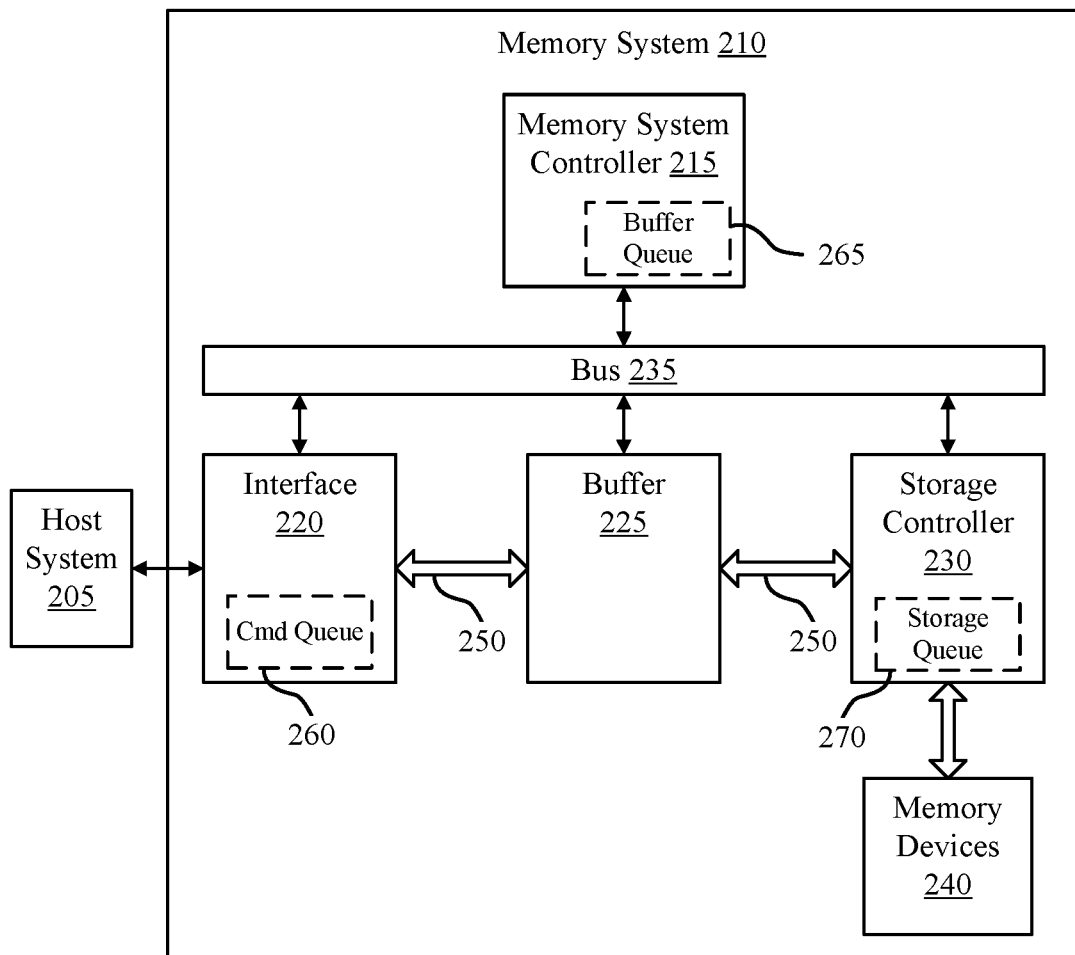
FIG. 2 illustrates an example of a system that supports environmental condition tracking for a memory system in accordance with examples as disclosed herein.

Features of the disclosure are initially described in the context of systems, devices, and circuits with reference to FIGS. 1 through 2. Features of the disclosure are described in the context of an environment, a system, and a process flow diagram with reference to FIGS. 3-5. These and other features of the disclosure are further illustrated by and described in the context of an apparatus diagram and flowchart that relate to environmental condition tracking for a memory system with reference to FIGS. 6 and 7.

FIG. 1 illustrates an example of a system 100 that supports environmental condition tracking for a memory system in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support environmental condition tracking for a memory system. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some instances, the host system 105, the memory system 110, or both may include one or more sensors (e.g., temperature sensors). The sensor(s) may be configured to monitor a temperature of an environment of the system 100, a temperature of one or more memory devices 130 during an access operation, or both. For example, the host system 105 may include a temperature sensor configured to identify a temperature of an environment of the system 100 while various access operations are performed on the memory device 130. Additionally or alternatively, the memory system 110 may include a temperature sensor configured to identify a temperature of a particular memory device 130 while various access operations are performed on the respective memory device 130.

The temperature data gathered by the sensor(s) may be used to determine a performance characteristic of the memory system 110. For example, data may be written to the memory device 130-*a* while the memory device 130-*a* is at a first temperature (e.g., that is identified by a sensor associated with the memory system 110). The same data may later be read from the memory device 130-*a*, which may be at a different (e.g., a higher or a lower) temperature. Accordingly, the memory system controller 115 (or the host system controller 106) may determine a performance characteristic of the memory system 110, which may include a latency associated with the memory device 130-*a*, a bandwidth of the memory device 130-*a*, a likelihood of an error occurring based on performing the access operations(s), or the like, that is based on a correlation between the first temperature and the second temperature. The performance characteristic may be utilized by the memory system controller 115 (or the host system 105) during subsequent access operations to improve the overall performance of the memory system 110.

FIG. 2 illustrates an example of a system 200 that supports environmental condition tracking for a memory system in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some instances, the host system 205, the memory system 210, or both may include one or more sensors (e.g., temperature sensors). The sensor(s) may be configured to monitor a temperature of an environment of the system 200, a temperature of one or more memory devices 240 during an access operation, or both. For example, the host system 205 may include a temperature sensor configured to identify a temperature of an environment of the system 200 while various access operations are performed on the memory device 240. Additionally or alternatively, the memory system 210 may include a temperature sensor configured to identify a temperature of a particular memory device 240 while various access operations are performed on the respective memory device 240.

The temperature data gathered by the sensor(s) may be used to determine a performance characteristic of the memory system 210. For example, data may be written to a memory device 240 while the memory device 240 is at a first temperature (e.g., that is identified by a sensor associated with the memory system 210). The same data may later be read from the memory device 240, which may be at a different (e.g., a higher or a lower) temperature. Accordingly, the memory system controller 215 (or a host system controller) may determine a performance characteristic of the memory system 210, which may include a latency associated with the memory device 240, a bandwidth of the memory device 240, a likelihood of an error occurring based on performing the access operations(s), or the like, that is based on a correlation between the first temperature and the second temperature. The performance characteristic may be utilized by the memory system controller 215 (or the host system 205) during subsequent access operations to improve the overall performance of the memory system 210.

Figure 3:
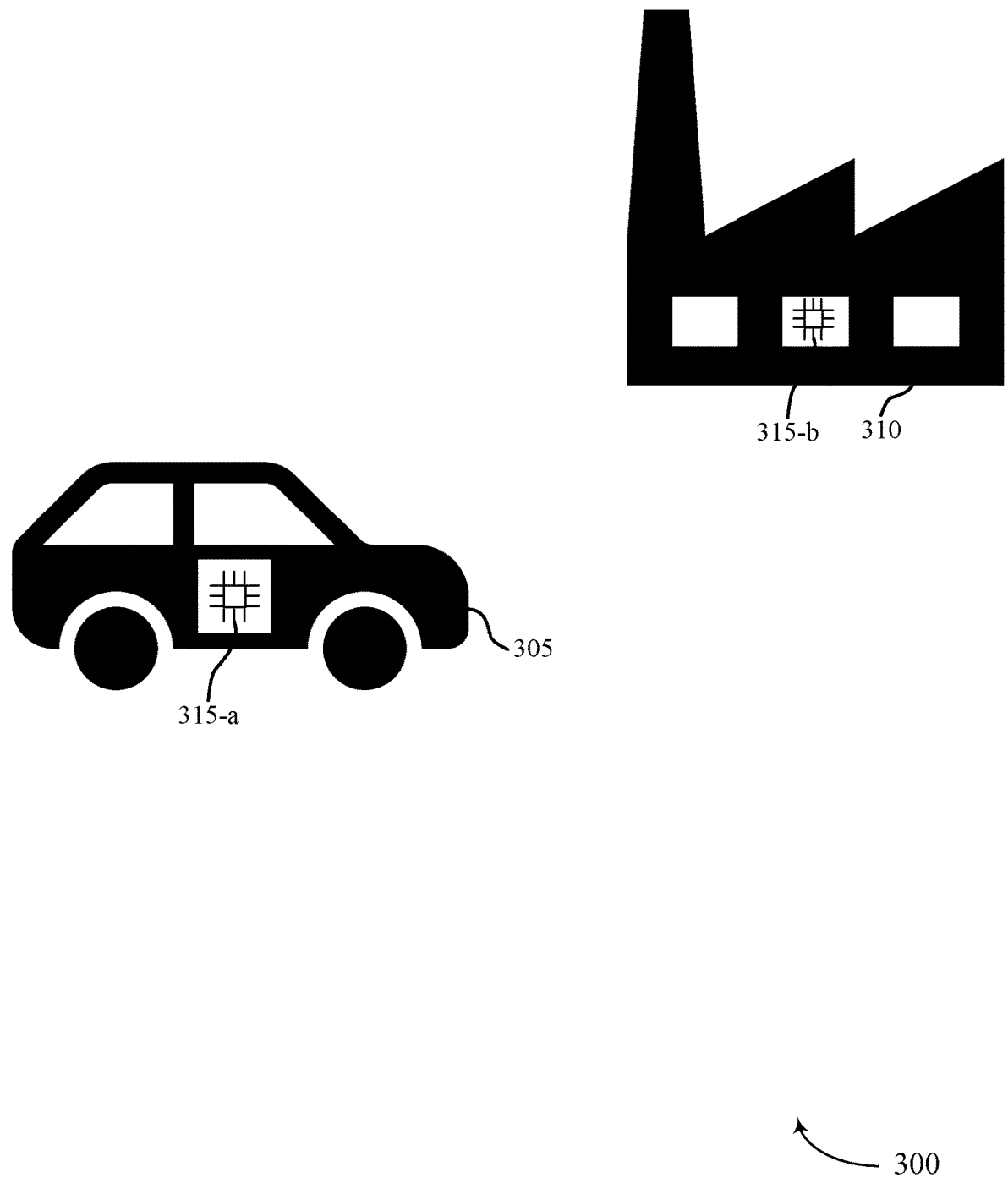
FIG. 3 illustrates an example of an environment that supports environmental condition tracking for a memory system in accordance with examples as disclosed herein.

FIG. 3 illustrates an example of an environment 300 of a sensor that supports environmental condition tracking for a memory system in accordance with examples as disclosed herein. The environment 300 may include a vehicle 305 and a manufacturing plant 310, which may be example environments of where a memory system may operate, may be manufactured, or may be tested. For example, a vehicle 305 may include a memory system having at least one sensor 315-a configured to determine one or more performance characteristics of an associated memory device based on its environmental or operating temperature. Additionally or alternatively, when a memory system is manufactured or tested (e.g., at a manufacturing plant 310), at least one sensor 315-b may be utilized to determine one or more performance characteristics of an associated memory device based on its environmental or operating temperature. The performance characteristic may be utilized by the memory system (e.g., by a controller of the memory system) during access operations to improve the overall performance of the memory system.

As described herein, some memory systems may be deployed in environments having a wide variety and range of environmental conditions. A vehicle 305, among other examples, may experience relatively high and relatively low temperatures over time. Because relatively high and relatively low operational temperatures may impact the performance of the associated memory system, it may be desirable to determine how a memory system operates under such conditions.

In some examples, data may be written to one or more memory cells of a component of the vehicle 305 when the vehicle is subject to a relatively high temperature. The data may be read from the memory cells of the component of the vehicle 305 at a second time when the vehicle is subject to a relatively low temperature (or a lower temperature than when the data was written). The difference in the temperature from when the data was written to when the data was read may introduce unwanted or unintended errors in the data or may otherwise affect the latency or bandwidth of the memory system. Accordingly, the memory system may determine a performance characteristic of the memory device (e.g., of the component of the vehicle 305), which may be used to improve the device's overall performance.

In other examples, during a manufacturing or testing operation (e.g., at a manufacturing plant 310) a memory system may be intentionally subjected to relatively high and relatively low temperatures. For example, data may be written to one or more memory cells of a memory device of the memory system while also being subjected to a relatively high temperature. The data may be read from the memory cells of the memory device at a second time when the memory system is subjected to a relatively low temperature (or a lower temperature than when the data was written). The difference in the temperature from when the data was written to when the data was read may introduce unwanted or unintended errors in the data or may otherwise affect the latency or bandwidth of the memory system. Accordingly, the memory system may determine a performance characteristic of the memory device when the device is being manufactured or tested (e.g., at the manufacturing plant 310), which may be used to improve the device's overall performance.

By determining a performance characteristic of a memory device based on a correlation between different temperatures, the performance of the associated memory system may be improved. For example, the sensors 315 may gather temperature data over a range of time, which may be used to identify scenarios that represent an environment in which the associated memory devices operate. In some instances, the scenarios may represent a likelihood of how a respective memory device will perform at a specific temperature, which may be identified using a probabilistic temperature model based on the data gathered from the sensors 315. The scenarios may be encoded into a controller of the associated memory device and may be detected upon the device booting up (e.g., powering on). The encoded scenarios may be used to improve the activation of error correction algorithms the detection of errors that occur when reading data from the memory device, among other improvements to the system's overall performance.

Additionally or alternatively, the data collected by the sensors (and associated performance characteristic(s)) may be written to a log and may periodically transmitted to a sever for use in designing and programming other memory systems. For example, a log may refer to an organizational structure of data that includes read temperatures, write temperatures, addresses (e.g., memory addresses for write operations and read operations), error metrics, and the like. The log(s) may be periodically uploaded to a server, which may refer to a location that is external to the memory device, such as a computer or system that provides resources, data, services, or programs to other computers, over a network. In some instances, data may be written to a log based on a triggering event, which may include a read operation, a write operation, activation of an error correction algorithm, a detection of an error when reading data, when a difference between a read temperature and a write temperature exceeds a threshold, or in other instances. The data written to the log(s) and transmitted to a server may be utilized to improve the overall performance of the associated memory system.

Figure 4:
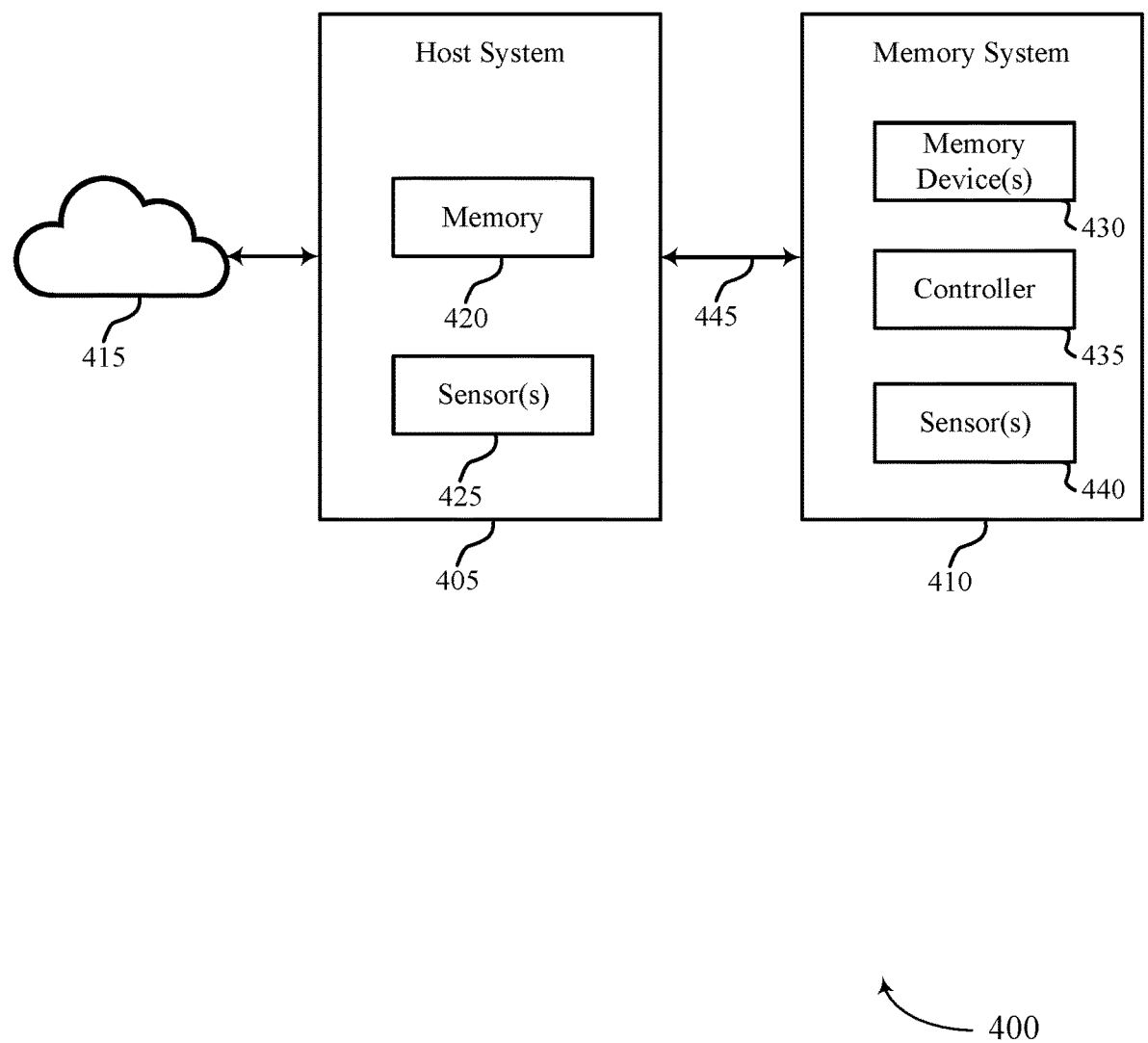
FIG. 4 illustrates an example of a system that supports environmental condition tracking for a memory system in accordance with examples as disclosed herein.

FIG. 4 illustrates an example of a system 400 that supports environmental condition tracking for a memory system in accordance with examples as disclosed herein. The system 400 may include a host system 405 and a memory system 410, which may be examples of a host system 205 and a memory system 210, respectively, as described with reference to FIG. 2. The host system 405 may also include a server 415 (e.g., a remote server 415) that that may receive data from the host system 205.

In some examples, the host system 405 may include memory 420 and one or more sensors 425 that are configured to identify operational temperatures associated with the system 400. For example, the sensors 425 may identify environmental temperatures associated with the host system 405 and memory system 410. Additionally or alternatively, the memory system 410 may include one or more memory devices 430, a controller 435, and one or more sensors 440. The sensors 440 may identify temperatures of the respective memory devices 430 during an associated access operation. Moreover, the sensors 440 may communicate the temperature data to the controller 435, which may communicate the data to the host system 405 via an I/O bus 445. As described herein, the data may be used to determine one or more performance characteristics of the memory system 410, which may be used to improve the overall performance of the memory system 410.

The sensors 425 of the host system 405 may be configured to identify or monitor the environmental temperature of the host system 405 and memory system 410. For example, the host system 405 and the memory system 410 may be included within a vehicle, such as the vehicle 305 as described with reference to FIG. 3. Accordingly, the sensors 425 may identify and monitor temperatures associated with the vehicle, generally.

In some instances, the sensors 425 may identify a temperature of the environment when access operations are performed. For example, when a write operation is performed on a memory cell of a memory device 430, the sensors 425 may identify the temperature (e.g., a first temperature). During a subsequent read operation, the sensors 425 may identify a temperature of the environment (e.g., a second temperature). The temperatures may be stored to a log (or logs), which may be stored to the memory 420. In some instances, the host system 405 may determine one or more performance characteristics of the memory system 410 based on the identified temperatures, whereas in other examples the host system 405 may transmit (e.g., upload) the log(s) to the server 415 and the performance characteristics may be determined using the data included in the uploaded logs.

In other examples, the sensors 425 may monitor a temperature of the environment for a duration. For example, the sensors 425 may monitor the temperature over a duration where multiple access operations are performed on one or more of the memory devices 430. The temperatures may be stored to a log (or logs), which may be stored to the memory 420. In some instances, the host system 405 may determine one or more performance characteristics of the memory system 410 based on the monitored temperature. In some instances, the host system 405 may determine the performance characteristics based on a variation in the temperature over the duration, whereas in other examples the host system 405 may transmit (e.g., upload) the log(s) to the server 415 and the performance characteristics may be determined using the data included in the uploaded logs.

In other examples, the sensors 440 of the memory system 410 may be configured to identify or monitor the temperature of one or more memory devices 430. For example, the host system 405 and the memory system 410 may be included within a vehicle, such as the vehicle 305 as described with reference to FIG. 3. Accordingly, the sensors 440 may identify and monitor temperatures associated with respective memory devices 430 (e.g., memory devices associated with one or more components of the vehicle) over a duration or upon an access operation being performed on a respective memory device 430.

In some instances, the sensors 440 may identify a temperature of a particular memory device 430 when access operations are performed. For example, when a write operation is performed on a memory cell of a memory device 430, the sensors 440 may identify the temperature (e.g., a first temperature) of the respective memory device 430. During a subsequent read operation, the sensors 440 may identify a temperature of the respective memory device 430 (e.g., a second temperature). The controller 435 may store the temperatures to a log (or logs), which may be stored in the memory 420 of the host system 405. In other examples, the memory system 410 may include memory dedicated to store the logs.

Upon the logs being stored, the controller 435 or the host system 405 may determine one or more performance characteristics of the memory system 410 based on the identified temperatures, whereas in other examples the controller 435 may transmit the logs to the host system 405 (e.g., via the I/O bus 445), and the host system 405 may transmit (e.g., upload) the log(s) to the server 415. In such an examples, the performance characteristics may be determined after the logs are uploaded and may be determined using the data included in the uploaded logs.

In other examples, the sensors 440 may monitor a temperature of one or more memory devices 430 for a duration. For example, the sensors 440 may monitor the temperature over a duration where multiple access operations are performed on one or more of the memory devices 430. The controller 435 may store the temperatures to a log (or logs), which may be stored to local memory (e.g., memory associated with the memory system 410) or to the memory 420. In some instances, the controller 435 or host system 405 may determine one or more performance characteristics of the memory system 410 based on the monitored temperature. In some instances, the controller 435 or host system 405 may determine the performance characteristics based on a variation in the temperature over the duration, whereas in other examples the controller 435 may transmit the logs to the host system 405 (e.g., via the I/O bus 445), and the host system 405 may transmit (e.g., upload) the log(s) to the server 415. In such examples, the performance characteristics may be determined after the logs are uploaded to the server 415, and may be determined using the data included in the uploaded logs.

As described herein, a log may refer to organizational structure of data, such as a table, that includes read temperatures, write temperatures, addresses (e.g., physical block memory addresses for write operations and read operations), error metrics, and the like. The log(s) may be uploaded to the server 415 at different instances, which may be a matter of design choice. For example, the logs may be periodically uploaded at an interval (e.g., a periodic interval) or based on a size of a log exceeding a threshold size. Additionally or alternatively, multiple logs may be written to and subsequently uploaded to the server 415.

For example, a first log may be associated with write operations performed on one or more of the memory devices 430. The first log may include a current temperature (e.g., a temperature at the instance a write operation is performed), as well as a physical address of the memory device that data is written to. In some instances, the first log may be written to after each write operation performed on the memory devices 430.

Additionally or alternatively, a second log may be associated with read operations performed on one or more of the memory devices 430. The second log may include a current temperature (e.g., a temperature at the instance a read operation is performed), as well as a physical address of the memory device that data is written to and an error metric that is triggered by one or more events (e.g., a triggering event). An error metric may refer to an activation of one or more error correction algorithms, such as LDPC decoding, the detection of one or more errors in the data read from the memory devices 430, or when difference between the temperature of the environment exceeds a threshold (e.g., when the difference between the temperature during the write operation and the temperature during the read operation exceeds a threshold temperature value). In other instances, the second log may be written to after each read operation performed on the memory devices 430.

The first log and the second log may then be uploaded to the server 415 periodically. For example, the logs may be uploaded when the second log (e.g., the read log) exceeds a threshold size or after a predefined time period (e.g., at a predefined time interval). As described herein, when the logs are uploaded may be a matter of design choice and, in some examples, a performance characteristic of the memory system 410 may be determined upon the logs being uploaded to the server 415. Moreover, the performance characteristic(s) may be encoded in the controller 435 such that when the memory system 410 boots up (e.g., powers on), its overall performance may be improved based on the encoded performance characteristics.

Figure 5:
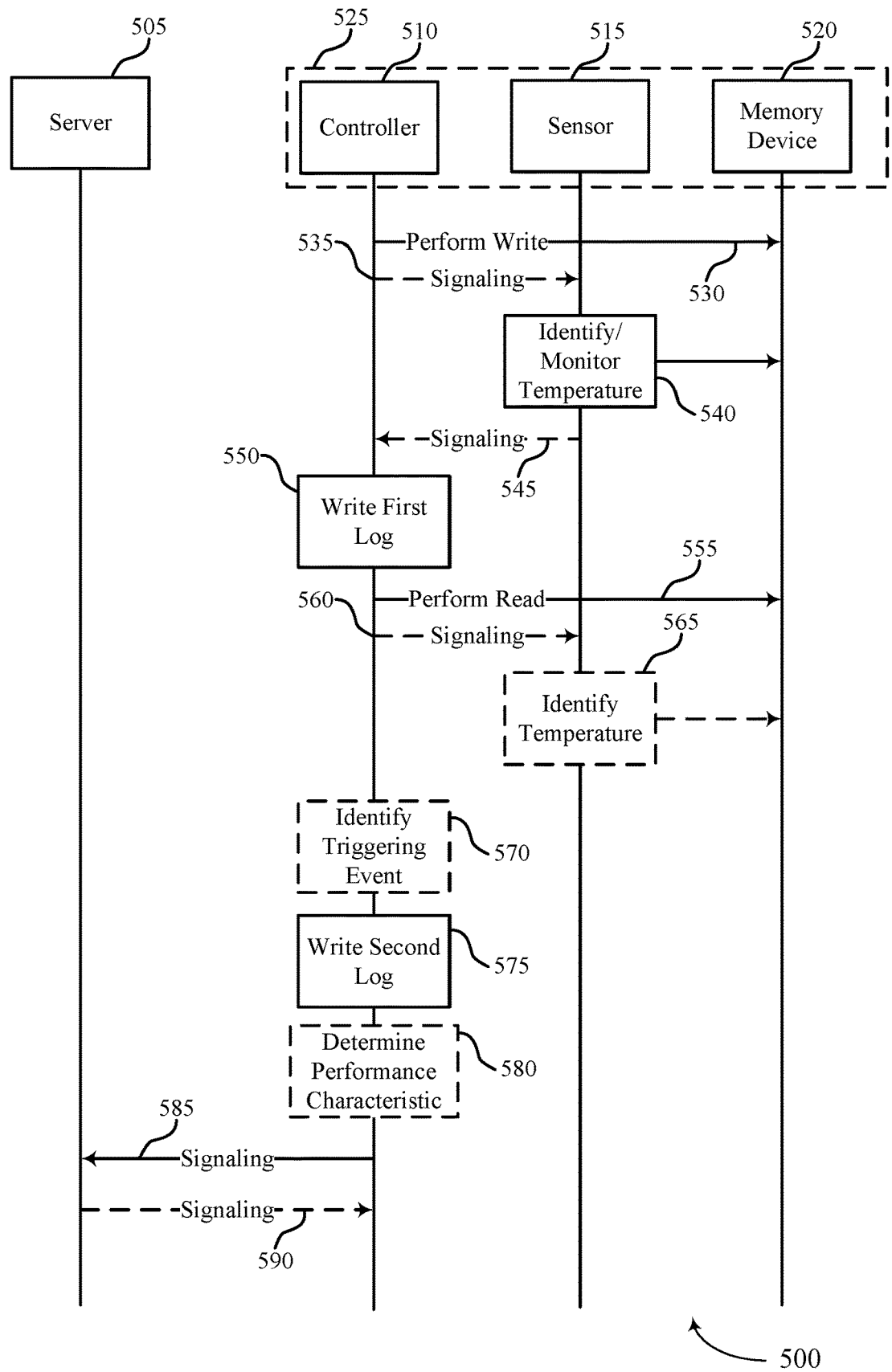
FIG. 5 illustrates an example of a process flow diagram that supports environmental condition tracking for a memory system in accordance with examples as disclosed herein.

FIG. 5 illustrates an example of a process flow diagram 500 that supports environmental condition tracking for a memory system in accordance with examples as disclosed herein. The process flow diagram 500 may include a server 505, a controller 510, a sensor 515, and a memory device 520, which may be examples of a server 415, a controller 435, and a memory device 430, respectively, as described with reference to FIG. 4. In some examples, the controller 510, the sensor 515, and the memory device 520 may be included in a system 525 that may include a host system (not shown) and a memory system and may be included within a vehicle (e.g., a vehicle 305 as described with reference to FIG. 3). In other examples, the system 525 may not be included within a vehicle and the process flow diagram 500 may instead illustrate operations performed during manufacturing or a testing operation (e.g., the operations may be performed at a manufacturing plant 310 as described with reference to FIG. 3). In either instance, the sensor 515 may gather data (e.g., temperature data) from the memory device 520, which may be used to determine one or more performance characteristics of the system 525, which may be used to improve its overall performance.

At 530, the controller 510 may perform a write operation on the memory device 530. In some examples, the write operation may be performed based on the controller 510 receiving signaling from a host system (not shown). The write operation performed at 530 may result in data being written to one or more memory cells of the memory device 520, and the memory cells may be associated with a particular physical address (e.g., a particular physical block address of the memory device 520).

At 535, the controller 535 may transmit signaling to the sensor 515 based on the write operation being performed. In some instances, the signaling may instruct the sensor 515 to capture (e.g., identify) a temperature of the memory device 520 (or the environment the system 525 is operating in). In other examples, the signaling may instruct the sensor 515 to begin monitoring a temperature of the memory device 520 (or the environment the system 525 is operating in). If the signaling instructs the sensor 515 to begin monitoring a temperature of the memory device 520 (or its environment), the sensor 515 may continue monitoring the temperature for a duration, until a read operation is performed on the same physical address of the memory device 520, until further signaling is received from the controller 510, or the like.

At 540, the sensor 515 may identify a temperature (e.g., a first temperature) of the memory device 520. Additionally or alternatively, the sensor 515 may identify a temperature (e.g., a first temperature) of the environment the system 525 is operating in. In other examples, the sensor 515 may begin monitoring the temperature of the memory device 520 or its environment based on the signaling received at 535.

At 545, the sensor may transmit signaling to the controller 510. The signaling may include a temperature (e.g., the first temperature) of the memory device 520 or of the environment that the system 525 is operating in. In other instances, if the sensor 515 is monitoring the temperature of the memory device 520 or its environment, the signaling 545 may indicate a real-time temperature of the memory device 520 or may indicate a temperature of the memory device 520 or its environment at periodic intervals. In the event that the sensor 515 is monitoring the temperature of the memory device 520 or its environment, the signaling at 545 may be received by the controller 510 continually or at more than one instance, which is not illustrated in FIG. 5.

At 550, the controller may write an entry (e.g., data) to a first log. The entry may include the temperature of the memory device 520 (or the environment of the system 525) and the physical address of the data written to the memory device 520 (e.g., at 530). In some instances, entries may be written to the first log after each write operation is performed and a temperature of the memory device 520 at the time of the write operation is identified. In some instances, the controller 510 may write an entry to the first log during a subset of write operations performed on the memory device 530. The controller 510 may select which write operations result in writing a first log based on a sampling rate (e.g., a sampling rate parameter), or based on a quantity of first logs written to while the memory device 530 was operated at a same or similar temperature, among other criteria.

At 555, the controller 510 may perform a read operation on the memory device 530. In some examples, the read operation may be performed based on the controller 510 receiving signaling from a host system (not shown). The read operation performed at 530 may result in data being read from a same physical address as the write operation performed at 530.

At 560, the controller 535 may transmit signaling to the sensor 515 based on the read operation being performed. In some instances, the signaling may instruct the sensor 515 to capture (e.g., identify) a temperature of the memory device 520 (or the environment the system 525 is operating in). In other examples, if the sensor 515 is continually monitoring a temperature of the memory device 520 (or the environment the system 525 is operating in), signaling may not be transmitted at 560 and the sensor 515 may continue monitoring the temperature.

At 565, the sensor 515 may identify a temperature (e.g., a second temperature) of the memory device 520. Additionally or alternatively, the sensor 515 may identify a temperature (e.g., a second temperature) of the environment the system 525 is operating in. In other examples, the sensor 515 may continue monitoring the temperature of the memory device 520 or its environment based on the signaling received at 535.

At 570, the controller 510 may identify a triggering event that may result in an entry (e.g., data) being written to a second log. In some examples, a triggering event may include the controller 510 detecting an error associated with the read operation (e.g., at 555), an activation of an error control code for correcting an error associated with data stored to the memory device 520, or an initiation of one or more maintenance operations on the memory device 520. Additionally or alternatively, the triggering event may include determining that a difference between the first temperature (e.g., identified at 540) and the second temperature (e.g., identified at 565) exceeds a first temperature threshold or determining that the second temperature exceeds a second temperature threshold. In some examples, a maintenance operation of the memory system may include examples of any operation that occurs in the background (e.g., transparent to the host system). Examples of such maintenance operations may include garbage collection operations or other operations.

At 575, the controller may write an entry (e.g., data) to the second log. The entry may include the temperature of the memory device 520 (or the environment of the system 525), the physical address of the data read from the memory device 520 (e.g., at 555), and an error metric associated with the read operation. As described herein, an error metric may refer to an activation of one or more error control algorithms, such as LDPC decoding, error detection algorithms, or error correction algorithms, the detection of one or more errors in the data read from the memory devices 520, or when difference between the temperature of the environment exceeds a threshold (e.g., when the difference between the temperature during the write operation and the temperature during the read operation exceeds a threshold temperature value). The second log may be written upon the detection of the triggering event (e.g., at 570) or, in other examples, may occur based on the detection or identification of an error metric.

At 580, the controller 580 may determine a performance characteristic of the memory device 520 based on a correlation between the first temperature (e.g., identified at 540) and the second temperature (e.g., identified at 565). In other examples, the performance characteristic may be based on a variation in the temperature over a duration (e.g., between performing the write at 530 and performing the read at 555). Determining the performance characteristic may include generating a probabilistic temperature model based on the difference between the first and second temperatures. For example, the performance characteristic may include generating one or more scenarios about the performance of the memory device 520 at different temperatures.

The performance characteristic may be used to improve the overall performance of the system 525. For example, if errors are commonly experienced when operating under some temperature conditions (or when a difference between a temperature during a write operation and during a read operation exceeds a threshold), the controller 510 may be able to activate error control algorithms more efficiently. Accordingly, in some examples, the performance characteristics may be programmed (e.g., encoded) into the controller 510 and the controller may identify the performance characteristics upon the system 525 booting up. In other examples (not shown), the performance characteristics described herein may be determined after the logs are transmitted (e.g., uploaded) to the server 505.

At 585, the controller 510 may transmit signaling to the server 505. In some examples, the signaling may include the performance characteristic determined by the controller 510 (e.g., at 580). In other examples, the signaling may include at least the first temperature and the second temperature identified by the sensor 515. In yet another example, the signaling may include the first log and the second log. The signaling may be transmitted to the server 505 periodically (e.g., at a predefined interval) or, in other examples, may be transmitted when a size of the second log exceeds a threshold size. In some instances, until the logs are uploaded to the server 505, the controller 510 may suspend writing the first log and the second log. A logging cycle may end after the logs are transmitted to the server 505. The controller 510 may write second logs for a subset of the read events. For instance, the controller 510 may only write second logs when a first log was previously written to for data written at a same physical address within a same logging cycle.

At 590, the server 505 may transmit one or more operational parameters to the controller 510. In some examples, the server 505 may transmit the operational parameters that are based on the performance characteristic. For example, the performance characteristic may be associated with scenarios about the performance of the memory device 520 at different temperatures. Thus, in some examples, the operational parameters may be used to improve the overall performance of the system 525.

Figure 6:
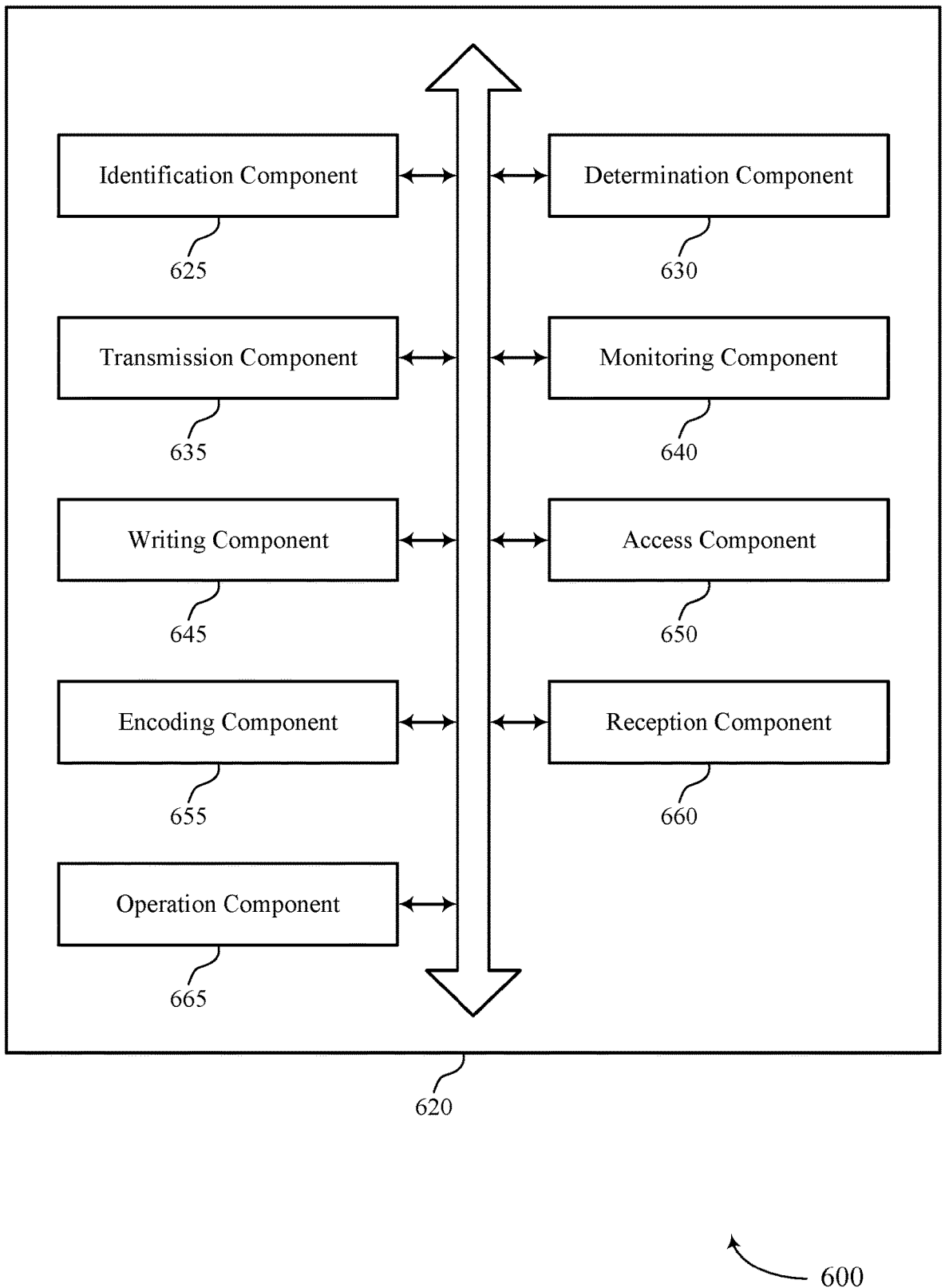
FIG. 6 shows a block diagram of a memory device that supports environmental condition tracking for a memory system in accordance with examples as disclosed herein.

FIG. 6 shows a block diagram 600 of a memory device 620 that supports environmental condition tracking for a memory system in accordance with examples as disclosed herein. The memory device 620 may be an example of aspects of a memory device as described with reference to FIGS. 1 through 5. The memory device 620, or various components thereof, may be an example of means for performing various aspects of environmental condition tracking for a memory system as described herein. For example, the memory device 620 may include an identification component 625, a determination component 630, a transmission component 635, a monitoring component 640, a writing component 645, an access component 650, an encoding component 655, a reception component 660, an operation component 665, or any combination thereof. Each of these components may communicate, directly or indirectly, with one another (e.g., via one or more buses).

The identification component 625 may be configured as or otherwise support a means for identifying a first temperature of a memory device at a first time associated with performing a write operation on a memory cell of the memory device. In some examples, the identification component 625 may be configured as or otherwise support a means for identifying a second temperature of the memory device at a second time associated with performing a read operation on the memory cell of the memory device, where the second time occurs after the first time.

In some examples, the identification component 625 may be configured as or otherwise support a means for identifying an occurrence of a triggering event, where writing the second entry to the second log is based at least in part on the occurrence of the triggering event, where the triggering event includes a detection of an error associated with reading data from the memory cell of the memory device, an activation of an error control code for correcting an error associated with data stored to the memory cell of the memory device, or an initiation of one or more maintenance operations on the memory device.

In some examples, the identification component 625 may be configured as or otherwise support a means for identifying an occurrence of a triggering event, where writing the second entry to the second log is based at least in part on the occurrence of the triggering event, where the triggering event includes a determination that a difference between the first temperature and the second temperature exceeds a first temperature threshold or a determination that the second temperature exceeds a second temperature threshold.

The determination component 630 may be configured as or otherwise support a means for determining a performance characteristic of the memory device based at least in part on a correlation between the first temperature of the memory device and the second temperature of the memory device. In some examples, the determination component 630 may be configured as or otherwise support a means for determining a variation in the temperature over the duration, where determining the performance characteristic of the memory device is based at least in part on determining the variation in the temperature over the duration.

The transmission component 635 may be configured as or otherwise support a means for transmitting the performance characteristic of the memory device based at least in part on determining the performance characteristic of the memory device. In some examples, the transmission component 635 may be configured as or otherwise support a means for transmitting, to a server, the first log and the second log occurs based at least in part on a size of the second log exceeding a threshold, at a periodic interval, or both.

In some examples, to support transmitting the performance characteristic, the transmission component 635 may be configured as or otherwise support a means for transmitting the first temperature and the second temperature to a server.

In some examples, the monitoring component 640 may be configured as or otherwise support a means for monitoring, for a duration, a temperature of the memory device, where the duration occurs between the first time and the second time.

In some examples, the writing component 645 may be configured as or otherwise support a means for writing a first entry to a first log based at least in part on identifying the first temperature of the memory device at the first time, where the first entry of the first log includes the first temperature and an address of the memory cell of the memory device. In some examples, the writing component 645 may be configured as or otherwise support a means for writing a second entry to a second log based at least in part on identifying the second temperature of the memory device at the second time, where the second entry of the second log includes the second temperature and the address of the memory cell of the memory device, where determining the performance characteristic of the memory device is based at least in part on writing the first entry to the first log and writing the second entry to the second log.

In some examples, the performance characteristic includes a likelihood of an occurrence of an error at the memory device, a latency of the memory device, a bandwidth of the memory device, or a combination thereof. In some examples, determining the performance characteristic of the memory device is based at least in part on writing the first entry to the first log and writing the second entry to the second log.

In some examples, the access component 650 may be configured as or otherwise support a means for performing the write operation on the memory cell of the memory device, where identifying the first temperature of the memory device at the first time is based at least in part on performing the write operation on the memory cell of the memory device. In some examples, the access component 650 may be configured as or otherwise support a means for performing the read operation on the memory cell of the memory device based at least in part on identifying the first temperature of the memory device at the first time, where identifying the second temperature of the memory device at the second time is based at least in part on performing the read operation on the memory cell of the memory device.

In some examples, the encoding component 655 may be configured as or otherwise support a means for encoding the performance characteristic of the memory device, where transmitting the performance characteristic of the memory device to a server includes transmitting the encoded performance characteristic.

In some examples, the reception component 660 may be configured as or otherwise support a means for receiving one or more operating parameters of the memory device from a server based at least in part on transmitting the performance characteristic of the memory device to the server.

In some examples, the operation component 665 may be configured as or otherwise support a means for operating the memory device according to the one or more operating parameters received from the server.

Figure 7:
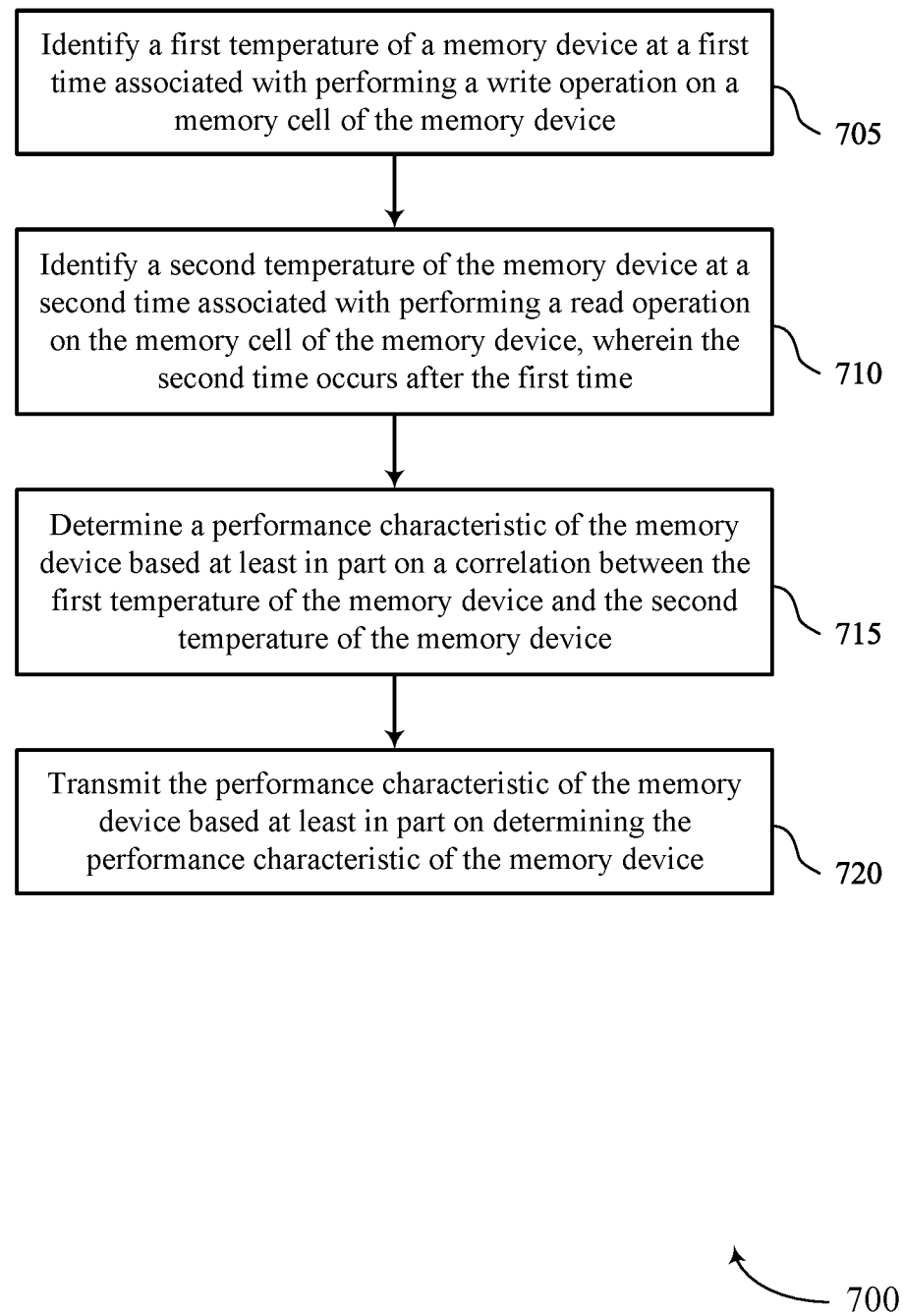
FIG. 7 shows a flowchart illustrating a method or methods that support environmental condition tracking for a memory system in accordance with examples as disclosed herein.

FIG. 7 shows a flowchart illustrating a method 700 that supports environmental condition tracking for a memory system in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally or alternatively, the memory device may perform aspects of the described functions using special-purpose hardware.

At 705, the method may include identifying a first temperature of a memory device at a first time associated with performing a write operation on a memory cell of the memory device. The operations of 705 may be performed in accordance with examples as disclosed herein. In some examples, aspects of the operations of 705 may be performed by an identification component 625 as described with reference to FIG. 6.

At 710, the method may include identifying a second temperature of the memory device at a second time associated with performing a read operation on the memory cell of the memory device, where the second time occurs after the first time. The operations of 710 may be performed in accordance with examples as disclosed herein. In some examples, aspects of the operations of 710 may be performed by an identification component 625 as described with reference to FIG. 6.

At 715, the method may include determining a performance characteristic of the memory device based at least in part on a correlation between the first temperature of the memory device and the second temperature of the memory device. The operations of 715 may be performed in accordance with examples as disclosed herein. In some examples, aspects of the operations of 715 may be performed by a determination component 630 as described with reference to FIG. 6.

At 720, the method may include transmitting the performance characteristic of the memory device based at least in part on determining the performance characteristic of the memory device. The operations of 720 may be performed in accordance with examples as disclosed herein. In some examples, aspects of the operations of 720 may be performed by a transmission component 635 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for identifying a first temperature of a memory device at a first time associated with performing a write operation on a memory cell of the memory device; identifying a second temperature of the memory device at a second time associated with performing a read operation on the memory cell of the memory device, where the second time occurs after the first time; determining a performance characteristic of the memory device based at least in part on a correlation between the first temperature of the memory device and the second temperature of the memory device; and transmitting the performance characteristic of the memory device based at least in part on determining the performance characteristic of the memory device.

Aspect 2: The apparatus of aspect 1, further including operations, features, circuitry, logic, means, or instructions, or any combination thereof for monitoring, for a duration, a temperature of the memory device, where the duration occurs between the first time and the second time and determining a variation in the temperature over the duration, where determining the performance characteristic of the memory device is based at least in part on determining the variation in the temperature over the duration.

Aspect 3: The apparatus of any of aspects 1 through 2, further including operations, features, circuitry, logic, means, or instructions, or any combination thereof for the performance characteristic includes a likelihood of an occurrence of an error at the memory device, a latency of the memory device, a bandwidth of the memory device, or a combination thereof.

Aspect 4: The apparatus of any of aspects 1 through 3, further including operations, features, circuitry, logic, means, or instructions, or any combination thereof for writing a first entry to a first log based at least in part on identifying the first temperature of the memory device at the first time, where the first entry of the first log includes the first temperature and an address of the memory cell of the memory device and writing a second entry to a second log based at least in part on identifying the second temperature of the memory device at the second time, where the second entry of the second log includes the second temperature and the address of the memory cell of the memory device, where determining the performance characteristic of the memory device is based at least in part on writing the first entry to the first log and writing the second entry to the second log.

Aspect 5: The apparatus of aspect 4, further including operations, features, circuitry, logic, means, or instructions, or any combination thereof for identifying an occurrence of a triggering event, where writing the second entry to the second log is based at least in part on the occurrence of the triggering event, where the triggering event includes a detection of an error associated with reading data from the memory cell of the memory device, an activation of an error control code for correcting an error associated with data stored to the memory cell of the memory device, or an initiation of one or more maintenance operations on the memory device.

Aspect 6: The apparatus of any of aspects 4 through 5, further including operations, features, circuitry, logic, means, or instructions, or any combination thereof for identifying an occurrence of a triggering event, where writing the second entry to the second log is based at least in part on the occurrence of the triggering event, where the triggering event includes a determination that a difference between the first temperature and the second temperature exceeds a first temperature threshold or a determination that the second temperature exceeds a second temperature threshold.

Aspect 7: The apparatus of any of aspects 4 through 6, further including operations, features, circuitry, logic, means, or instructions, or any combination thereof for determining the performance characteristic of the memory device is based at least in part on writing the first entry to the first log and writing the second entry to the second log.

Aspect 8: The apparatus of any of aspects 4 through 7, further including operations, features, circuitry, logic, means, or instructions, or any combination thereof for transmitting, to a server, the first log and the second log occurs based at least in part on a size of the second log exceeding a threshold, at a periodic interval, or both.

Aspect 9: The apparatus of any of aspects 1 through 8, further including operations, features, circuitry, logic, means, or instructions, or any combination thereof for performing the write operation on the memory cell of the memory device, where identifying the first temperature of the memory device at the first time is based at least in part on performing the write operation on the memory cell of the memory device and performing the read operation on the memory cell of the memory device based at least in part on identifying the first temperature of the memory device at the first time, where identifying the second temperature of the memory device at the second time is based at least in part on performing the read operation on the memory cell of the memory device.

Aspect 10: The apparatus of any of aspects 1 through 9, further including operations, features, circuitry, logic, means, or instructions, or any combination thereof for encoding the performance characteristic of the memory device, where transmitting the performance characteristic of the memory device to a server includes transmitting the encoded performance characteristic.

Aspect 11: The apparatus of any of aspects 1 through 10, further including operations, features, circuitry, logic, means, or instructions, or any combination thereof for receiving one or more operating parameters of the memory device from a server based at least in part on transmitting the performance characteristic of the memory device to the server and operating the memory device according to the one or more operating parameters received from the server.

Aspect 12: The apparatus of any of aspects 1 through 11 where transmitting the performance characteristic, further includes operations, features, circuitry, logic, means, or instructions, or any combination thereof for transmitting the first temperature and the second temperature to a server.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    identifying a first temperature of a memory device at a first time associated with performing a write operation on a memory cell of the memory device;
    identifying a second temperature of the memory device at a second time associated with performing a read operation on the memory cell of the memory device, wherein the second time occurs after the first time;
    determining a performance characteristic of the memory device based at least in part on a correlation between the first temperature of the memory device and the second temperature of the memory device;
    transmitting the performance characteristic of the memory device based at least in part on determining the performance characteristic of the memory device;
    receiving one or more operating parameters of the memory device from a host based at least in part on transmitting the performance characteristic of the memory device to the host; and
    operating the memory device according to the one or more operating parameters received from the host.

2. The method of claim 1, further comprising:
    monitoring, for a duration, a temperature of the memory device, wherein the duration occurs between the first time and the second time; and
    determining a variation in the temperature over the duration, wherein determining the performance characteristic of the memory device is based at least in part on determining the variation in the temperature over the duration.

3. The method of claim 1, wherein the performance characteristic comprises a likelihood of an occurrence of an error at the memory device, a latency of the memory device, a bandwidth of the memory device, or a combination thereof.

4. A method, comprising:
    identifying a first temperature of a memory device at a first time associated with performing a write operation on a memory cell of the memory device;
    writing a first entry to a first log based at least in part on identifying the first temperature of the memory device at the first time, wherein the first entry of the first log comprises the first temperature and a physical address of the memory cell of the memory device;
    identifying a second temperature of the memory device at a second time associated with performing a read operation on the memory cell of the memory device, wherein the second time occurs after the first time;
    writing a second entry to a second log based at least in part on identifying the second temperature of the memory device at the second time, wherein the second entry of the second log comprises the second temperature and the physical address of the memory cell of the memory device;
    determining a performance characteristic of the memory device based at least in part on writing the first entry to the first log and writing the second entry to the second log; and
    transmitting the performance characteristic of the memory device based at least in part on determining the performance characteristic of the memory device.

5. The method of claim 4, further comprising:
    tracking one or more events associated with the first log and the second log based at least in part on one or more configurable statistical parameters, one or more previously written logs, a quantity of available storage space in the first log, the second log, or both, or a combination thereof.

6. The method of claim 4, further comprising:
    identifying an occurrence of a triggering event, wherein writing the second entry to the second log is based at least in part on the occurrence of the triggering event, wherein the triggering event comprises a detection of an error associated with reading data from the memory cell of the memory device, an activation of an error control code for correcting an error associated with data stored to the memory cell of the memory device, or an initiation of one or more maintenance operations on the memory device.

7. The method of claim 4, further comprising:
    identifying an occurrence of a triggering event, wherein writing the second entry to the second log is based at least in part on the occurrence of the triggering event, wherein the triggering event comprises a determination that a difference between the first temperature and the second temperature exceeds a first temperature threshold or a determination that the second temperature exceeds a second temperature threshold.

8. The method of claim 4, further comprising:
transmitting, to a server, the first log and the second log occurs based at least in part on a size of the second log exceeding a threshold, at a periodic interval, or both.

9. The method of claim 1, further comprising:
performing the write operation on the memory cell of the memory device, wherein identifying the first temperature of the memory device at the first time is based at least in part on performing the write operation on the memory cell of the memory device; and
performing the read operation on the memory cell of the memory device based at least in part on identifying the first temperature of the memory device at the first time, wherein identifying the second temperature of the memory device at the second time is based at least in part on performing the read operation on the memory cell of the memory device.

10. A method, comprising:
identifying a first temperature of a memory device at a first time associated with performing a write operation on a memory cell of the memory device;
identifying a second temperature of the memory device at a second time associated with performing a read operation on the memory cell of the memory device, wherein the second time occurs after the first time;
determining a performance characteristic of the memory device based at least in part on a correlation between the first temperature of the memory device and the second temperature of the memory device;
encoding the performance characteristic of the memory device; and
transmitting the performance characteristic of the memory device to a server based at least in part on determining the performance characteristic of the memory device, wherein transmitting the performance characteristic of the memory device to the server comprises transmitting the encoded performance characteristic.

11. The method of claim 1, wherein transmitting the performance characteristic further comprises:
transmitting the first temperature and the second temperature to a server.

12. An apparatus, comprising:
a memory device; and
a controller coupled with the memory device, wherein the controller is configured to cause the apparatus to:
identify a first temperature of the memory device at a first time associated with performing a write operation on a memory cell of the memory device;
identify a second temperature of the memory device at a second time associated with performing a read operation on the memory cell of the memory device, wherein the second time occurs after the first time;
determine a performance characteristic of the memory device based at least in part on a correlation between the first temperature of the memory device and the second temperature of the memory device;
transmit the performance characteristic of the memory device based at least in part on determining the performance characteristic of the memory device;
receive one or more operating parameters of the memory device from a host based at least in part on transmitting the performance characteristic of the memory device to the host; and
operate the memory device according to the one or more operating parameters received from the host.

13. The apparatus of claim 12, wherein the controller is further configured to cause the apparatus to:
monitor, for a duration, a temperature of the memory device, wherein the duration occurs between the first time and the second time; and
determine a variation in the temperature over the duration, wherein determining the performance characteristic of the memory device is based at least in part on determining the variation in the temperature over the duration.

14. The apparatus of claim 12, wherein the performance characteristic comprises a likelihood of an occurrence of an error at the memory device, a latency of the memory device, a bandwidth of the memory device, or a combination thereof.

15. An apparatus, comprising:
a memory device; and
a controller coupled with the memory device, wherein the controller is configured to cause the apparatus to:
identify a first temperature of the memory device at a first time associated with performing a write operation on a memory cell of the memory device;
write a first entry to a first log based at least in part on identifying the first temperature of the memory device at the first time, wherein the first entry of the first log comprises the first temperature and an address of the memory cell of the memory device;
identify a second temperature of the memory device at a second time associated with performing a read operation on the memory cell of the memory device, wherein the second time occurs after the first time;
write a second entry to a second log based at least in part on identifying the second temperature of the memory device at the second time, wherein the second entry of the second log comprises the second temperature and the address of the memory cell of the memory device;
determine a performance characteristic of the memory device based at least in part on writing the first entry to the first log and writing the second entry to the second log; and
transmit the performance characteristic of the memory device based at least in part on determining the performance characteristic of the memory device.

16. The apparatus of claim 15, wherein the controller is further configured to cause the apparatus to:
identify an occurrence of a triggering event, wherein writing the second entry to the second log is based at least in part on the occurrence of the triggering event, wherein the triggering event comprises a detection of an error associated with reading data from the memory cell of the memory device, an activation of an error control code for correcting an error associated with data stored to the memory cell of the memory device, or an initiation of one or more maintenance operations on the memory device.

17. The apparatus of claim 15, wherein the controller is further configured to cause the apparatus to:
identify an occurrence of a triggering event, wherein writing the second entry to the second log is based at least in part on the occurrence of the triggering event, wherein the triggering event comprises a determination that a difference between the first temperature and the second temperature exceeds a first temperature threshold or a determination that the second temperature exceeds a second temperature threshold.

18. The apparatus of claim 15, wherein the controller is further configured to cause the apparatus to:

transmit, to a server, the first log and the second log occurs based at least in part on a size of the second log exceeding a threshold, at a periodic interval, or both.

19. The apparatus of claim 12, wherein the controller is further configured to cause the apparatus to:

perform the write operation on the memory cell of the memory device, wherein identifying the first temperature of the memory device at the first time is based at least in part on performing the write operation on the memory cell of the memory device; and perform the read operation on the memory cell of the memory device based at least in part on identifying the first temperature of the memory device at the first time, wherein identifying the second temperature of the memory device at the second time is based at least in part on performing the read operation on the memory cell of the memory device.

20. The apparatus of claim 12, wherein the controller is further configured to cause the apparatus to:

encode the performance characteristic of the memory device, wherein transmitting the performance characteristic of the memory device to a server comprises transmitting the encoded performance characteristic.

21. A non-transitory computer-readable medium storing code, the code comprising instructions executable by a processor to:

identify a first temperature of a memory device at a first time associated with performing a write operation on a memory cell of the memory device;

identify a second temperature of the memory device at a second time associated with performing a read operation on the memory cell of the memory device, wherein the second time occurs after the first time;

determine a performance characteristic of the memory device based at least in part on a correlation between the first temperature of the memory device and the second temperature of the memory device;

transmit the performance characteristic of the memory device based at least in part on determining the performance characteristic of the memory device;

receive one or more operating parameters of the memory device from a host based at least in part on transmitting the performance characteristic of the memory device to the host; and operate the memory device according to the one or more operating parameters received from the host.

* * * * *